United States Patent
Lee et al.

(10) Patent No.: US 6,836,186 B2
(45) Date of Patent: Dec. 28, 2004

(54) AB CLASS AMPLIFIER FOR CONTROLLING QUIESCENT CURRENT

(75) Inventors: Jae-youn Lee, Incheon (KR); Jun-seok Han, Yongin (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/417,680

(22) Filed: Apr. 17, 2003

(65) Prior Publication Data

US 2003/0210094 A1 Nov. 13, 2003

(30) Foreign Application Priority Data

May 7, 2002 (KR) .......................................... 2002-25134

(51) Int. Cl.$^7$ .............................. H03F 3/10; H03F 3/45
(52) U.S. Cl. ....................................... 330/264; 330/257
(58) Field of Search ................................. 330/264, 257

(56) References Cited

U.S. PATENT DOCUMENTS

| | | | |
|---|---|---|---|
| 5,083,051 A | * 1/1992 | Whatley et al. ............ | 327/310 |
| 5,361,041 A | * 11/1994 | Lish ........................... | 330/255 |
| 5,537,079 A | 7/1996 | Gosser et al. ............... | 330/265 |
| 5,786,731 A | * 7/1998 | Bales .......................... | 330/267 |
| 5,939,904 A | 8/1999 | Fetterman et al. ........... | 327/67 |
| 5,973,563 A | * 10/1999 | Seven ......................... | 330/265 |
| 6,150,853 A | * 11/2000 | Chrappan et al. ........... | 327/108 |
| 6,369,653 B1 | 4/2002 | Kappes ....................... | 330/267 |

FOREIGN PATENT DOCUMENTS

| | | | |
|---|---|---|---|
| JP | 5022113 | 1/1993 | ....... H03K/19/0185 |
| JP | 8148985 | 6/1996 | ....... H03K/19/0175 |
| JP | 9270684 | 10/1997 | ............ H03K/5/24 |
| JP | 10084272 | 3/1998 | ....... H03K/19/0175 |
| JP | 11088141 | 3/1999 | ....... H03K/19/0175 |
| KR | 2000-34921 | 6/2000 | ........... G11C/11/34 |

OTHER PUBLICATIONS

US 2002/0171478 A1 of Wouters.*

* cited by examiner

Primary Examiner—Patricia Nguyen
(74) Attorney, Agent, or Firm—Mills & Onello LLP

(57) ABSTRACT

An AB class buffer amplifier controls quiescent current. The AB class buffer amplifier includes a first current controller and a second current controller. The first current controller sources current to an output node in response to a first logic level of a first signal, and buffers and outputs an input voltage to the output node in response to a second logic level of the first signal. The second current controller sinks the current from the output node in response to a second logic level of a second signal, and buffers and outputs the input voltage to the output node in response to a first logic level of the second signal. The first and second signals are generated at the first logic levels if the input voltage is higher than the output voltage and at the second logic level if the input voltage is lower than the output voltage. The AB class buffer amplifier may further include comparing unit which compares the input voltage with an output voltage from the output node and generates the first and second signals in response to the compared results. The comparing unit includes first and second comparators. Accordingly, the AB class buffer amplifier can drive an external circuit using high currents by freely controlling the amount of quiescent current, and easily sourcing and sinking quiescent current flowing to an output node of the amplifier.

30 Claims, 5 Drawing Sheets

AB CLASS AMPLIFIER FOR CONTROLLING QUIESCENT CURRENT

BACKGROUND OF THE INVENTION

This application claims the priority of Korean Patent Application No. 2002-25134, filed May 7, 2002, in the Korean Intellectual Property Office, the disclosure of which is incorporated herein in its entirety by reference.

1. Field of the Invention

The present invention relates to an amplifier, and more particularly, to an AB class buffer amplifier which is capable of reducing power consumption by controlling quiescent current and driving current when operating as a B class amplifier.

2. Description of the Related Art

FIG. 1 is a diagram of a driver for driving a liquid crystal of a thin-film transistor-type liquid crystal display. Referring to FIG. 1, to drive a liquid crystal 140, input voltages V1, V2, and V3, having different voltage levels, are applied to the liquid crystal 140 via voltage-follower-type amplifiers 110, 120, and 130.

In order to display several colors, the liquid crystal 140 has to be charged, with various voltage levels, or discharged. In other words, a first switch SW1 is turned on to drive the liquid crystal 140 with a first input voltage V1, and if necessary, the first switch SW1 is turned off and a second switch SW2 is turned on to drive the liquid crystal 1410 with a second input voltage V2. Current passing through the liquid crystal 140 must be rapidly sunk or absorbed. Thus, the voltage follower-type amplifiers 110, 120, and 130 used for driving the liquid crystal 140 must be AB class buffer amplifiers.

However, it is difficult for conventional AB class buffer amplifiers to control quiescent current since the intensity of the quiescent current is hundreds of thousands of uA. In other words, since integrated circuits included in portable products, such as drivers of liquid crystal displayers, require currents in the range of hundreds of thousands of uA, it is difficult to apply AB class buffer amplifiers to such circuits.

FIG. 2 is a diagram of an output port of a conventional A class buffer amplifier to which a comparator is added. Referring to FIG. 2, an output port 200 of a conventional A class buffer amplifier includes a PMOS transistor MP and an NMOS transistor MN1. A signal ODA output from an input node of an amplifier (not shown) is applied to a gate of the PMOS transistor MP. The output port 200 of the A class buffer amplifier further includes a comparator 210 and an NMOS transistor MN2. The NMOS transistor MN2 is connected between an output node ONODE and a ground voltage VSS, and a signal SOUT output from the comparator 210 is applied to the gate of the NMOS transistor.

The output port 200 of the A class buffer amplifier shown in FIG. 2 readily controls the quiescent current and turns on the PMOS transistor MP to readily increase the level of the voltage VOUT output from the output node ONODE. However, if the level of the output voltage VOUT is high, current has to flow to the ground voltage VSS in order to lower the level of the output voltage VOUT.

Here, it is difficult to rapidly sink the current toward the ground voltage VSS since the NMOS transistor MN1 is turned on for a predetermined period of time by a bias voltage BIAS. Thus, the comparator 210 and the NMOS transistor NM2 are employed to address this problem.

If the output voltage VOUT becomes higher than an input voltage VIN, the comparator 210 outputs the signal SOUT at a high level. Then, the NMOS transistor MN2 is turned on and the current path is formed from the output node ONODE toward the ground voltage VSS to allow the current to flow. Thus, the output voltage VOUT may change to a lower level.

However, the comparator 210 used in the output node 200 of the A class buffer amplifier has an offset voltage. In other words, the comparator 210 outputs the signal SOUT at a high level only when the level of the output voltage VOUT becomes greater than the level input voltage VIN to a predetermined offset voltage or more. Thus, the minimum voltage level of the output voltage VOUT is determined by the offset voltage and the input voltage VIN.

FIG. 3 is a diagram of an output port of a conventional AB class buffer amplifier. Referring to FIG. 3, an output port 300 of a conventional AB class buffer amplifier includes a PMOS transistor MP and an NMOS transistor MN which are connected to each other in series between a power voltage VDD and a ground voltage VSS. A diode-type PMOS transistor M3 is connected between a gate of the PMOS transistor MP and the power voltage VDD, and a diode-type NMOS transistor M4 is connected between a gate of the NMOS transistor MN and the ground voltage VSS.

The gate of the PMOS transistor MP and the gate of the NMOS transistor MN are connected to a first current source IB1 and a second current source IB2, respectively.

A quiescent current IQ of the output port 300 of the AB class buffer amplifier is controlled by a ratio of the size of the PMOS transistor MP to the size of the diode-type PMOS transistor M3. The quiescent current IQ is also controlled according to the ratio of the size of the NMOS transistor MN to the size of the diode-type NMOS transistor M4.

In other words, the quiescent current IQ=bias current IB1*(MP/M3)=bias current IB1*(MN/M4).

Accordingly, the quiescent current IQ can be controlled to flow in a small amount by controlling the parameters of the transistors MP, M3, MN, and M4. However, the diode-type transistors M3 and M4 operate as loads of bias transistors M1 and M2. Thus, the diode-type transistors M3 and M4 reduce the gain of the output port 300. As a result, a signal output from the output port 300 of the AB class buffer amplifier does not fully swing.

As described above, a signal output from the output port 200 of the A class buffer amplifier shown in FIG. 2 does not fully swing due to the offset voltage, and a signal output from the output port 200 of the AB class buffer amplifier shown in FIG. 3 does not fully swing due to the diode-type transistors that operate as a load. Thus, an AB class buffer amplifier is required to drive an external circuit of an amplifier using a high intensity of current by controlling the quiescent current IQ so that a small amount of the flowing quiescent current IQ is easily sourced or sunk to an output port.

SUMMARY OF THE INVENTION

To address the above-described limitations, it is an object of the present invention to provide an AB class buffer amplifier which is capable of driving an external circuit using a high intensity of current by freely controlling the amount of quiescent current and readily sourcing and sinking the quiescent current to an output port of the AB buffer amplifier.

Accordingly, to achieve the above object, there is provided an AB class buffer amplifier according to a first embodiment of the present invention. The AB class buffer amplifier includes a first current controller and a second current controller.

The first current controller sources current to an output node in response to a first logic level of a first signal, and buffers and outputs an input voltage to the output node in response to a second logic level of the first signal.

The second current controller sinks the current from the output node in response to a second logic level of a second signal, and buffers and outputs an input voltage to the output node in response to a first logic level of the second signal.

Here, the first and second signals are generated at the first logic level if the input voltage is higher than the output voltage and at the second logic level if the input voltage is lower than the output voltage.

The AB class buffer amplifier may further include comparing unit which compares the input voltage with an output voltage from the output node and generates the first and second signals in response to the compared results. The comparing unit includes first and second comparators.

The first comparator receives the input voltage via a positive node and the output voltage via a negative node, compares the input voltage with the output voltage, and generates the first signal.

The second comparator receives the input voltage via a positive node and the output voltage via a negative node, compares the input voltage with the output voltage, and generates the second signal.

The first current controller includes first through third transistors and a first current source.

The first transistor has a first node which is connected to a power voltage. The second transistor has a first node which is connected to a second node of the first transistor, a gate which is supplied with the first signal, and a second node which is connected to a gate of the first transistor.

The third transistor has a first node which is connected to the power voltage, a gate which is connected to a gate of the first transistor, and a second node which is connected to the output node. The first current source is connected between the second node of the second transistor and a ground voltage, and generates a first bias current.

The first through third transistors are PMOS transistors. The first current source may be an NMOS transistor which is connected between the second node of the second transistor and the ground voltage, and has a gate to which a predetermined first bias voltage is applied.

The second current controller includes fourth through sixth transistors and a second current source.

The fourth transistor has a first node which is connected to the ground voltage. The fifth transistor has a first node which is connected to a second node of the fourth transistor, a gate which is connected to the second signal, and a second node which is connected to a gate of the fourth transistor.

The sixth transistor has a first node which is connected to the ground voltage, a gate which is connected to a gate of the fourth transistor, and a second node which is connected to the output node. The second current source is connected between the second node of the fifth transistor and the power voltage, and generates a second bias current.

The fourth through sixth transistors are NMOS transistors. The second current source may be a PMOS transistor which is connected between the second node of the fifth transistor and the power voltage, and has a gate to which a predetermined bias voltage is applied.

To achieve the above object, there is provided an AB class buffer amplifier according to a second embodiment of the present invention. The AB class buffer amplifier includes a first current controller and a second current controller.

The first current controller is turned off in response to a first logic level of a first signal and turned on in response to a second logic level of the first signal in order to source current to an output node.

The second current controller sinks the current from the output node in response to a second logic level of a second signal, and buffers and outputs an input voltage to the output node in response to a first logic level of the second signal.

The AB class buffer amplifier may further include a differential amplifier and a comparator.

The differential amplifier receives the input voltage via a negative node and an output voltage from the output node via a positive node, compares the input voltage with the output voltage, and generates a comparison result as the first signal.

The comparator receives the input voltage via a positive node and the output voltage via a negative node, and compares the input voltage with the output voltage, and generates a comparison result as the second signal.

The first signal is generated at the second logic level if the input voltage is higher than the output voltage and at the first logic level if the input voltage is lower than the output voltage of the output node, and the second signal is generated at the first logic level if the input voltage is higher than the output voltage of the output node and at the second logic level if the input voltage is lower than the output voltage of the output node.

The first current controller is a first transistor which has a first node connected to a power voltage, a second node connected to the output node, and a gate connected to the first signal.

The second current controller includes second through fourth transistors and a bias transistor.

The second transistor has a first node which is connected to a ground voltage. The third transistor has a first node which is connected to a second node of the second transistor, a gate which is connected to the second signal, and a second node which is connected to a gate of the second transistor.

The fourth transistor has a first node which is connected to the ground voltage, a gate which is connected to a gate of the second transistor, and a second node which is connected to the output node. The bias transistor is connected between the second node of the third transistor and the power voltage, and has a gate to which a predetermined bias voltage is applied.

The first transistor and the bias transistor are PMOS transistors, and the second through fourth transistors are NMOS transistors.

To achieve the above object, there is provided an AB class buffer amplifier according to a third embodiment of the present invention. The AB class buffer amplifier includes a first current controller and a second current controller.

The first current controller is turned on in response to a first logic level of a first signal in order to sink current from an output node and turned off in response to a second logic level of the first signal.

The second current controller sources current to the output node in response to a first logic level of the second signal, and buffers and outputs an input voltage to the output node in response to a second logic level of the second signal.

The AB class buffer amplifier may further include a differential amplifier and a comparator.

The differential amplifier receives the input voltage via a negative node and a voltage output from the output node via a positive node, compares the input voltage with the output voltage, and generates a comparison result as the first signal.

The comparator receives the input voltage via a positive node and the output voltage of the output node via negative node, compares the input voltage with the output voltage of the output node, and generates a comparison result as the second signal.

The first signal is generated at the second logic level if the input voltage is higher than the output voltage and at the first logic level if the input voltage is lower than the output voltage, and the second signal is generated at the first logic level if the input voltage is higher than the output voltage and as the second logic level if the input voltage is lower than the output voltage of the output node.

The first current controller is a first transistor which has a first node that is connected the ground voltage, a second node that is connected to the output node, and a gate that the first signal is applied to.

The second current controller includes second through fourth transistors and a bias transistor.

The second transistor has a first node which is connected to the power voltage. The third transistor has a first node which is connected a second node of the second transistor, a gate which is connected to the second signal, and a second node which is connected to a gate of the second transistor.

The fourth transistor has a first node which is connected to the power voltage, a gate which is connected to the gate of the second transistor, and a second node which is connected to the output node. The bias transistor is connected between the second node of the third transistor and the ground voltage, and has a gate to which a predetermined bias voltage is applied.

The first transistor and the bias transistor are NMOS transistors, and the second through fourth transistors are PMOS transistors.

To achieve the above object, there is provided an AB class buffer amplifier according to a fourth embodiment of the present invention. The AB class buffer amplifier includes a first current controller, a second current controller, and a comparing unit.

The first current controller sources current to an output node in response to a first logic level of a first signal, and buffers and outputs an input voltage to the output node in response to a second logic level of the first signal.

The second current controller buffers the input voltage in response to the first logic level of the first signal and outputs it to the output node, and sinks current from the output node in response to the second logic level of the first signal. The comparing unit compares a level of the input voltage with a level of the output voltage and generates a comparison result as the first signal.

The comparing unit is a comparator which receives the input voltage via a positive node and the output voltage of the output node via a negative node, compares the input voltage with the output voltage, and generates a comparison result as the first signal.

The first signal is generated at the first logic level if the input voltage is higher than the output voltage of the output node and at the second logic level if the input voltage is lower than the output voltage of the output node.

The first current controller includes first through third transistors and a first current source.

The first transistor has a first node which is connected to a power voltage. The second transistor has a first node which is connected a second node of the first transistor, a gate which is supplied with the first signal, and a second node which is connected to a gate of the first transistor.

The third transistor has a first node which is connected to the power voltage, a gate which is connected to a gate of the first transistor, and a second node which is connected to the output node. The first current source is connected between the second node of the second transistor and a ground voltage, and generates a first bias current.

The first through third transistors are PMOS transistors. The first current source may be an NMOS transistor which is connected between the second node of the second transistor and the ground voltage, and has a gate to which a predetermined first bias voltage is applied.

The second current controller includes fourth through sixth transistors and a second current source.

The fourth transistor has a first node which is connected to the ground voltage. The fifth transistor has a first node which is connected to a second node of the fourth transistor, a gate which is supplied with the first signal, and a second node which is connected to a gate of the fourth transistor.

The sixth transistor has a first node which is connected to the ground voltage, a gate which is connected to a gate of the fourth transistor, and a second node which is connected to the output node.

The second current source is connected between the second node of the fifth transistor and the power voltage, and generates a second bias current. The fourth through sixth transistors are NMOS transistors. The second current source may be a PMOS transistor which is connected between the second node of the fifth transistor and the power voltage, and has a gate to which a predetermined second bias voltage is applied.

BRIEF DESCRIPTION OF THE DRAWINGS

The above object and advantages of the present invention will become more apparent by describing in detail preferred embodiments thereof with reference to the attached drawings in which.

DETAILED DESCRIPTION OF PREFERRED EMBODIMENTS

Figure 1:
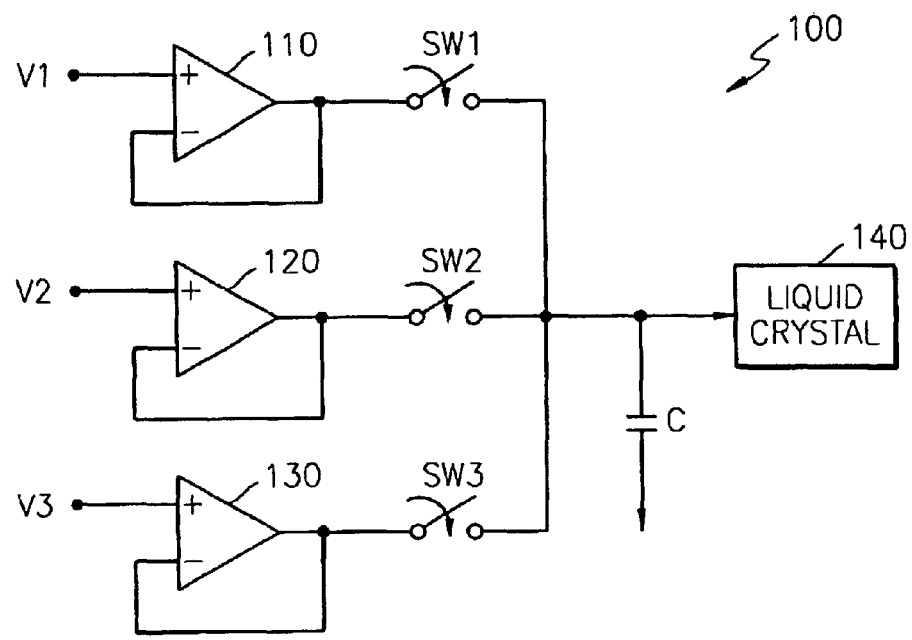
FIG. 1 is a diagram of a driver for driving a liquid crystal of a thin-film transistor-type liquid crystal displayer.
Figure 2:
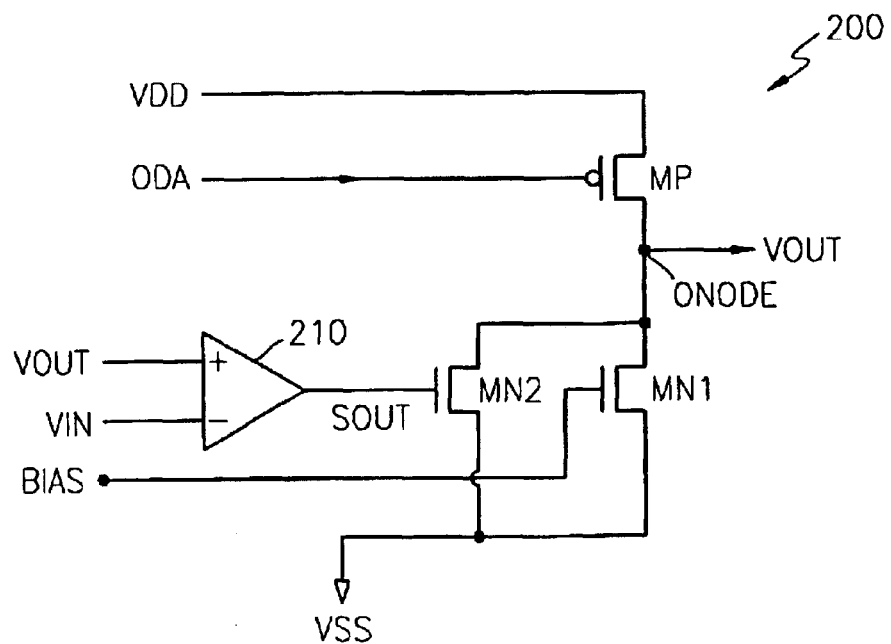
FIG. 2 is a diagram of an output port of a conventional A class buffer amplifier to which a comparator is added.
Figure 3:
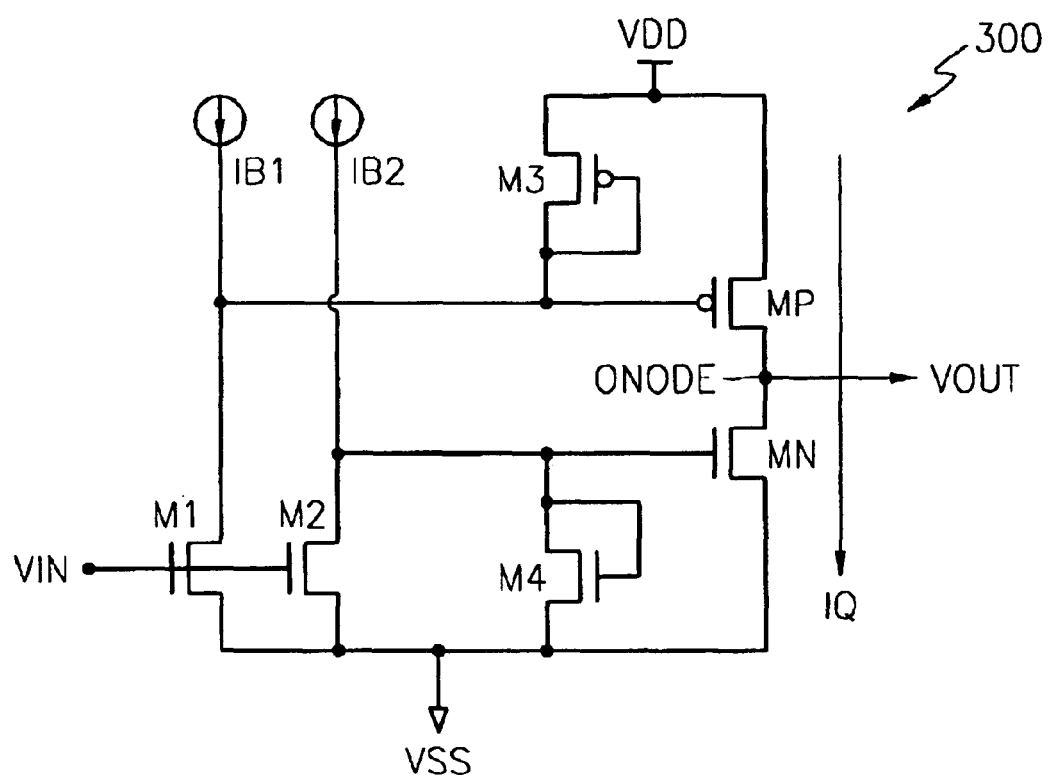
FIG. 3 is a diagram of an output port of a conventional AB class buffer amplifier.

The attached drawings for illustrating preferred embodiments of the present invention, and the contents written on the attached drawings are referred to in order to gain a sufficient understanding of the merits of the present invention and the operation thereof, and the objectives accomplished by the operation of the present invention.

Hereinafter, the present invention will be described in detail by explaining preferred embodiments of the present invention with reference to the attached drawings. Like reference numerals in the drawings denote the same members.

Figure 4:
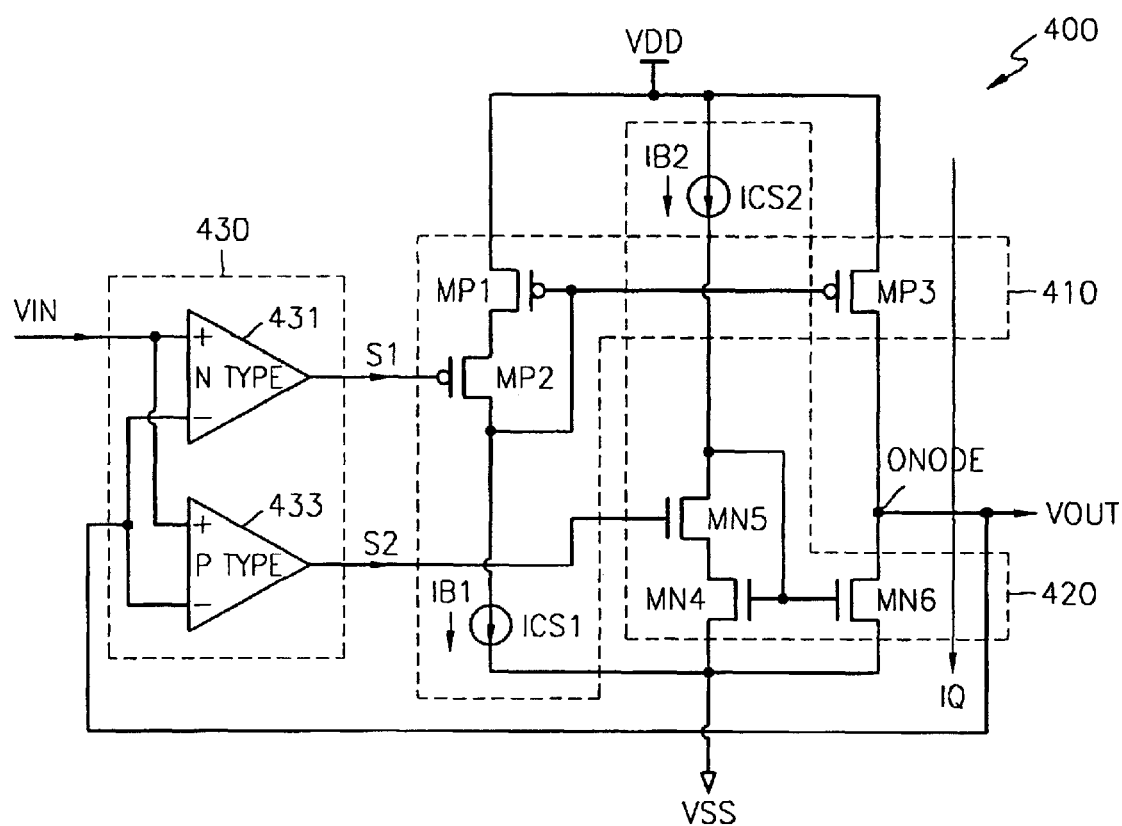
FIG. 4 is a diagram of an AB class amplifier according to a first embodiment of the present invention.

FIG. 4 is a diagram of an AB class amplifier according to a first embodiment of the present invention. Referring to FIG. 4, an AB class buffer amplifier 400 includes a first current controller 410 and a second current controller 420.

The first current controller 410 sources current to an output node ONODE in response to a first logic level of a first signal S1, and buffers an input voltage VIN and then outputs it to the output node ONODE in response to a second logic level of the first signal S1.

In more detail, the first current controller 410 includes first, second, and third transistors MP1, MP2, and MP3, and a first current source ICS1.

A first node of the first transistor MP1 is connected to a power voltage VDD. A first node of the second transistor MP2 is connected to a second node of the first transistor MP1, a gate thereof is connected to the first signal S1, and a second node thereof is connected to a gate of the first transistor MP1.

A first node of the third transistor MP3 is connected to the power voltage VDD, a gate thereof is connected to the gate of the second transistor MP2, and a second node thereof is connected to the output node ONODE. The first current source ICS1 is connected between the second node of the second transistor MP2 and a ground voltage VSS and generates a first bias current IB1.

The first, second, and third transistors MP1, MP2, and MP3 are PMOS transistors. The first current source ICS1 is connected between the second node of the second transistor MP2 and the ground voltage VSS and may be an NMOS transistor, a gate of which a predetermined first bias voltage is applied to.

The second current controller 420 sinks current from the output node ONODE in response to a second logic level of a second signal S2, and buffers the input voltage VIN and then outputs it to the output node ONODE in response to a first logic level of the second signal S2.

The first and second signals S1 and S2 are generated at first logic levels if the level of the input voltage VIN is higher than the level of an output voltage VOUT of the output node ONODE, and at second logic levels if the level of the input voltage VIN is lower than the level of the output voltage VOUT of the output node ONODE.

The second current controller 420 includes fourth, fifth, and sixth transistors MN4, MN5, and MN6 and a second current source ICS2.

A first node of the fourth transistor MN4 is connected to the ground voltage VSS. A first node of the fifth transistor MN5 is connected to a second node of the fourth transistor MN4, the second signal S2 is connected to a gate thereof, and a second node thereof is connected to a gate of the transistor MN4.

A first node of the sixth transistor MN6 is connected to the ground voltage VSS, a gate thereof is connected to a gate of the fourth transistor MN4, and a second node thereof is connected to the output node ONODE. The second current source ICS2 is connected between a second node of the fifth transistor MN5 and the power voltage VDD and generates a second bias current IB2.

The fourth, fifth, and sixth transistors MN4, MN5, and MN6 are NMOS transistors. The second current source ICS2 is connected between the second node of the fifth transistor MN5 and the power voltage VDD and may be a PMOS transistor, a gate of which receives a predetermined second bias voltage BIAS.

The AB class buffer amplifier 400 may further include a comparing unit 430, which compares the input voltage VIN with the output voltage VOUT of the output node ONODE and generates the compared result as the first and second signals S1 and S2. The comparing unit 430 includes first and second comparators 431 and 433.

The first comparator 431 receives the input voltage VIN via a positive node and the output voltage VOUT of the output node ONODE via a negative node, compares a level of the input voltage VIN with a level of output voltage VOUT, and generates the first signal S1.

The comparator 433 receives the input voltage VIN via a positive node and the output voltage VOUT of the output node ONODE via a negative node, compares a level of the input voltage VIN with a level of the output voltage VOUT, and generates the second signal S2.

Hereinafter, the operation of the AB class buffer amplifier according to the first embodiment of the present invention will be described in detail with reference to FIG. 4.

First, the operation of the AB class buffer amplifier will be described in a case where the level of the output voltage VOUT does not need to be changed and the level of the output voltage VOUT is the same as that of the input voltage VIN.

The AB class buffer amplifier 400 operates as a buffer, and in order to reduce the amount of quiescent current IQ, the first and second signals S1 and S2 are saturated in the second and fifth transistors MP2 and MN5, respectively.

If the second and fifth transistors MP2 and MP5 are saturated, the first and second current controllers 410 and 420 operate as current mirror-type devices. Thus, the quiescent current IQ is controlled according to the ratios of the transistors MP1 and MP3, and MN4 and MN6, and the first and second bias currents IB1 and IB2 generated by the first and second current sources ICS1 and ICS2.

The amount of the quiescent current IQ can therefore be reduced by controlling the sizes of the transistors MP1, MP3, MN4, and MN6.

In other words, if a ratio of the size of the first transistor MP1 to the size of the third transistor MP3 and a ratio of the size of the fourth transistor MN to the size of the sixth transistor MN6 are as follows:

MP1:MP3=MN4:MN6, quiescent current IQ=First bias current IB1*(MP3/MP1)= Second bias current IB2*(MN6/MN4). Here, it is assumed that the first and second bias currents IB1 and IB2 have the same value.

The voltage level of the first signal S1 output from the first comparator 431 is different from the voltage level of the second signal S2 output from the second comparator 433 so as to activate the second and fifth transistors MP2 and MN5 at the same time. The voltage levels of the first and second signals S1 and S2 may saturate the second and fifth transistors MP2 and MN5, respectively.

The first and second comparators 431 and 433 are configured as negative feedback types in which the output voltage VOUT is connected to negative nodes of the first and second comparators 431 and 433. Thus, the level of the input voltage VIN may become identical to the level of the output voltage VOUT, and the levels of the first and second signals S1 and S2 may saturate the second and fifth transistors MP2 and MN5, respectively.

The first comparator 431 receives the output voltage VOUT fed back via a gate of an NMOS transistor (not shown), and the second comparator 433 receives the output voltage VOUT fed back via a gate of a PMOS transistor (not shown).

The construction of the first and second comparators 431 and 433, which output the first and second signals S1 and S2 having different voltage levels so as to saturate the second and fifth transistors MP2 and MN5 at the same time, is apparent to those skilled in the art. Thus, their detailed descriptions will be omitted.

The operation of the AB class buffer amplifier will be now described for the case where the levels of the output voltage VOUT of the first and second comparators 431 and 433 need to be lowered, i.e., the level of the output voltage VOUT is higher than the level of the input voltage VIN.

If the level of the output voltage VOUT is higher than the level of the input voltage VIN, the first comparator 431 outputs the first signal S1 at the second logic level and the second comparator 433 outputs the second signal S2 at the second logic level. Then, the second transistor MP2 is kept saturated and the fifth transistor MN5 is turned off. Here, the second logic level is close to a low level. In other words, the second level saturates the second transistor MP2 and turns off the fifth transistor MN5.

In this case, the first current controller 410 is maintained to operate as a current mirror-type device while the second current controller 420 does not continue to operate as a current mirror-type device, since the fifth transistor MN5 is turned off.

The second current source ICS2 applies the second bias current IB2 to gates of the fourth and sixth transistors MN4 and MN6. Then, the fourth and sixth transistors MN4 and MN6 are both saturated.

If the second current controller 420 operates as a current mirror-type device, the fourth and sixth transistors MN4 and MN6 are saturated and the amount of the quiescent current IQ is controlled by a ratio of the size of the fourth transistor MN4 to the size of the sixth transistor MN6. Thus, the amount of the quiescent current IQ is reduced with a reduction in the second bias current IB2 of the second current source ICS2.

If the second current controller 420 does not operate as a current mirror-type device, the fourth and sixth transistors MN4 and MN6 can pass higher currents since their gate voltages increase more than if the second current controller 420 operates as a current mirror-type device. As the gate voltage of the sixth transistor MN6 increases, a current path is formed from the output node ONODE to the ground voltage VSS. Current is sunk from the output node ONODE to the ground voltage VSS. Then, the level of the output voltage VOUT can be lowered at a high speed.

The second current source ICS2 can be replaced by a PMOS transistor this is controlled by a bias voltage.

The operation of the AB class buffer amplifier 400 will now be described for the case where the level of the output voltage VOUT does need to be higher, i.e., the level of the output voltage VOUT is lower than a desired level.

If the level of the output voltage VOUT is lower than the level of the input voltage VIN, the first comparator 431 outputs the first signal S1 at the first logic level and the second comparator 433 outputs the second signal S1 at the first logic level. Therefore, the second transistor MP2 is turned off and the fifth transistor MN5 is saturated. Here, the first logic level is close to a high level. In other words, the first logic level turns off the second transistor MP2 and saturates the fifth transistor MN.

The second current controller 420 is maintained to operate as a current mirror-type device, while the first current controller 410 does not continue to operate as a current mirror-type device since the second transistor MP2 is turned off. The first current source ICS1 allows the first bias current IB1 to continuously flow toward the ground voltage VSS. Thus, voltage levels of gates of the first and third transistors MP1 and MP3 become lower. Then, the first and third transistors MP1 and MP3 become saturated.

If the first current controller 410 operates as a current mirror-type device, the first and third transistors MP1 and MP3 are saturated and the amount of the quiescent current IQ is controlled by a ratio of the size of the first transistor MP1 to the size of the third transistor MP3.

Thus, the amount of the quiescent current IQ is reduced with a reduction in the first bias current IB1 of the first current source ICS1.

If the first current controller 410 does not operate as a current mirror-type device, the first and third transistors MP1 and MP3 can pass higher currents since their gate voltages become lower than if the first current controller 400 operates as a current mirror-type device.

Since a gate voltage of the third transistor MP3 drops with a rise in a gate voltage of the sixth transistor MN6 increases, a current path is formed from the power voltage VDD to the output node ONODE. Current flows from the power voltage VDD to the output node ONODE. Then, the level of the output voltage VOUT becomes higher.

The first current source ICS1 may be replaced with an NMOS transistor which is controlled by a bias voltage.

The AB class buffer amplifier 400 according to the first embodiment of the present invention can drive an external circuit using higher current by freely controlling the amount of the quiescent current IQ and easily sourcing and sinking the current flowing to the output node ONODE.

Figure 5:
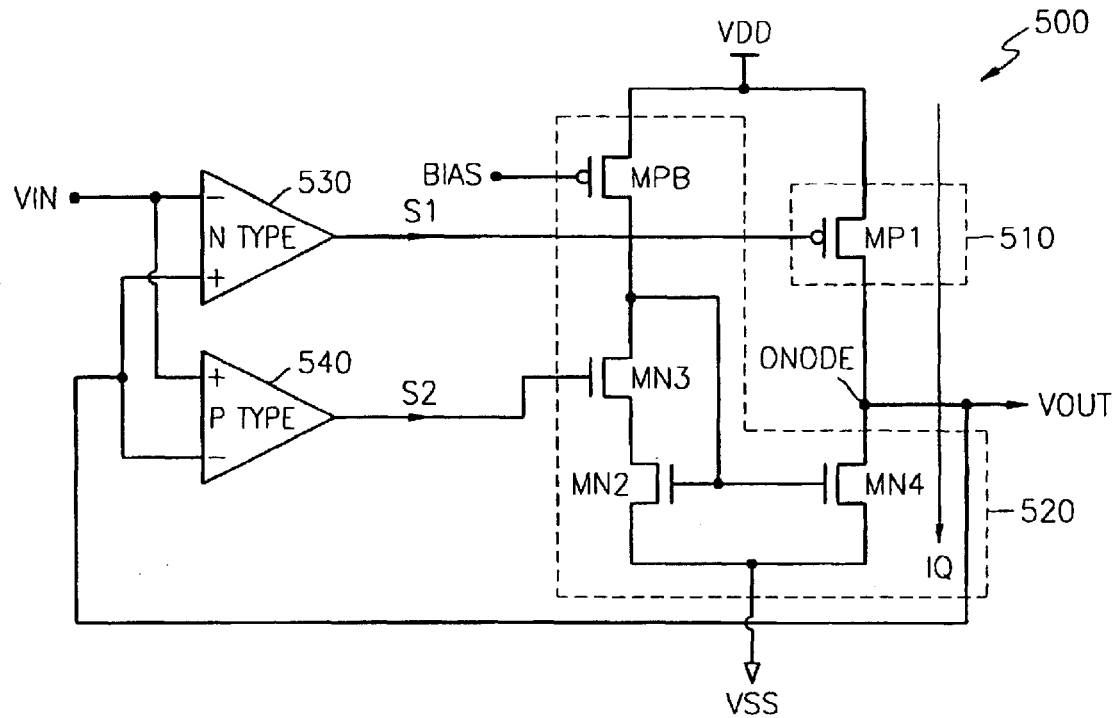
FIG. 5 is a diagram of an AB class amplifier according to a second embodiment of the present invention.

FIG. 5 is a diagram of an AB class amplifier according to a second embodiment of the present invention. Referring to FIG. 5, an AB class buffer amplifier 500 according to the second embodiment of the present invention includes a first current controller 510 and a second current controller 520.

The first current controller 510 is turned off in response to a first logic level of a first signal S1 and turned on in response to a second logic level of the first signal S1 so as to source currents to an output node ONODE.

The first signal S1 is generated at the second logic level if the level of the input voltage VIN is higher than the level of the voltage VOUT output from the output node ONODE, and at the first logic level if the level of the input voltage VIN is lower than the level of the voltage VOUT output from the output node ONODE.

In more detail, the first current controller 510 is a first transistor MP1 having a first node connected to a power voltage VDD, a second node connected to the output node ONODE, and a gate connected to the first signal S1.

The second current controller 520 sinks current from the output node ONODE in response to a second logic level of a second signal S2, and buffers the input voltage VIN and then outputs it to the output node ONODE in response to a first logic level of the second signal S2.

The second signal S2 is generated at the first logic level if the level of the input voltage VIN is higher than the level of the output voltage VOUT from the output node ONODE and as the second logic level if the level of the input voltage VIN is lower than the level of the voltage VOUT output from the output node ONODE.

In more detail, the second current controller 520 includes second, third, and fourth transistors MN2, MN3, and MN4, and a bias transistor MPB.

A first node of the second transistor MN2 is connected to the ground voltage VSS. A first node of the third transistor MN3 is connected to a second node of the second transistor MN2, a gate thereof is connected to the second signal S2, and a second node thereof is connected to a gate of the second transistor MN2.

A first node of the fourth transistor MN4 is connected to the ground voltage VSS, a gate thereof is connected to the gate of the second transistor MN2, and a second node thereof is connected to the output node ONODE. The bias transistor MPB is connected between the second node of the third transistor MN and the power voltage VSS and a predetermined bias voltage BIAS is applied to a gate of the bias transistor MPB.

The first and bias transistors MP1 and MPB are PMOS transistors, and the second, third, and fourth transistors MN2, MN3, and MN4 are NMOS transistors.

The AB class buffer amplifier 500 may further include a differential amplifier 530 and comparator 540.

The differential amplifier 530 receives the input voltage VIN via a negative node and the output voltage VOUT of the output node ONODE via a positive node, compares the input voltage VIN with the output voltage VOUT, and generates the compared result as the first signal S1.

The comparator 540 receives the input voltage VIN via a positive node and the output voltage VOUT of the output node ONODE via a negative node, compares the input voltage VIN with the output voltage VOUT, and generates the compared result as the second signal S2.

Hereinafter, the operation of the AB class buffer amplifier 500 according to the second embodiment of the present invention will be described in detail with reference to FIG. 5.

The first current controller 510 is turned off in response to the first logic level of the first signal S1. Here, the first logic level is close to a high level. The first logic level can also saturate the third transistor MN3. This will be described later.

The first logic level of the first signal S1 is generated if the level of the input voltage VIN is lower than the level of the output voltage VOUT of the output node ONODE.

If the level of the input voltage VIN is lower than the level of the output voltage VOUT of the output node ONODE, the second signal S2 is generated at the second logic level. Here, the second logic level is close to a low level. The second logic level can also saturate the first transistor MP1. Thus, the third transistor MN3 is turned off.

The bias voltage BIAS has a level for turning off the bias transistor MPB. In other words, the bias transistor MPB is kept turned on by the bias voltage BIAS. Thus, if the third transistor MN3 is turned off, gage voltages of the second fourth transistors MN2 and MN3 increase. Then, positive current flows to the ground voltage VSS through the output node ONODE and the level of the output voltage VOUT becomes lower. In other words, if the level of the output voltage VOUT needs to be lowered since the level of the output voltage VOUT is high, the AB class buffer amplifier 500 shown in FIG. 5 forms a current path from the output node ONODE toward the ground voltage VSS to lower the level of the output voltage VOUT at a high speed.

If the level of the input voltage VIN is higher than the level of the output voltage VOUT of the output node ONODE, the first signal S1 is output as the second logic level and the second signal S2 is output as the first logic level.

Then, the first transistor MP1 is saturated and the third transistor MN3 is also saturated. Since the third transistor MN3 is saturated, the second current controller 520 operates a current mirror-type device. The amount of the quiescent current IQ can be controlled by a ratio of the size of second transistor MN2 to the size of the fourth transistor MN4.

A current path is formed from the power voltage VDD to the output node ONODE by the saturated first transistor MP1, and current flows to the output node ONODE. Thus, the level of the output voltage VOUT becomes higher.

In summary, if the level of the output voltage VOUT is higher than the level of the input voltage VIN, the first signal S1 is output at the first logic level to turn off the first transistor MP1 and the second signal S2 is output at the second logic level to turn off the third transistor MN3. Thus, current is rapidly sunk and the level of the output voltage VOUT becomes lower.

In contrast, if the level of the input voltage VIN is lower than the level of the output voltage VOUT, the first signal S1 is output as the second logic level to saturate the first transistor MP1 and the second signal S2 is output as the first logic level to saturate the third transistor MN3. Thus, the second current controller 520 operates as a current mirror-type device, and the amount of the quiescent current IQ is reduced. Also, the current is rapidly sourced by the first transistor MP1 and the level of the output voltage VOUT becomes higher.

The AB class buffer amplifier 500 according to the second embodiment of the present invention can rapidly change the level of the output voltage VOUT by easily controlling the amount of the quiescent current IQ using a ratio of the size of the second transistor MN2 to the size of the fourth transistor MN4 and rapidly sourcing and sinking the current.

Figure 6:
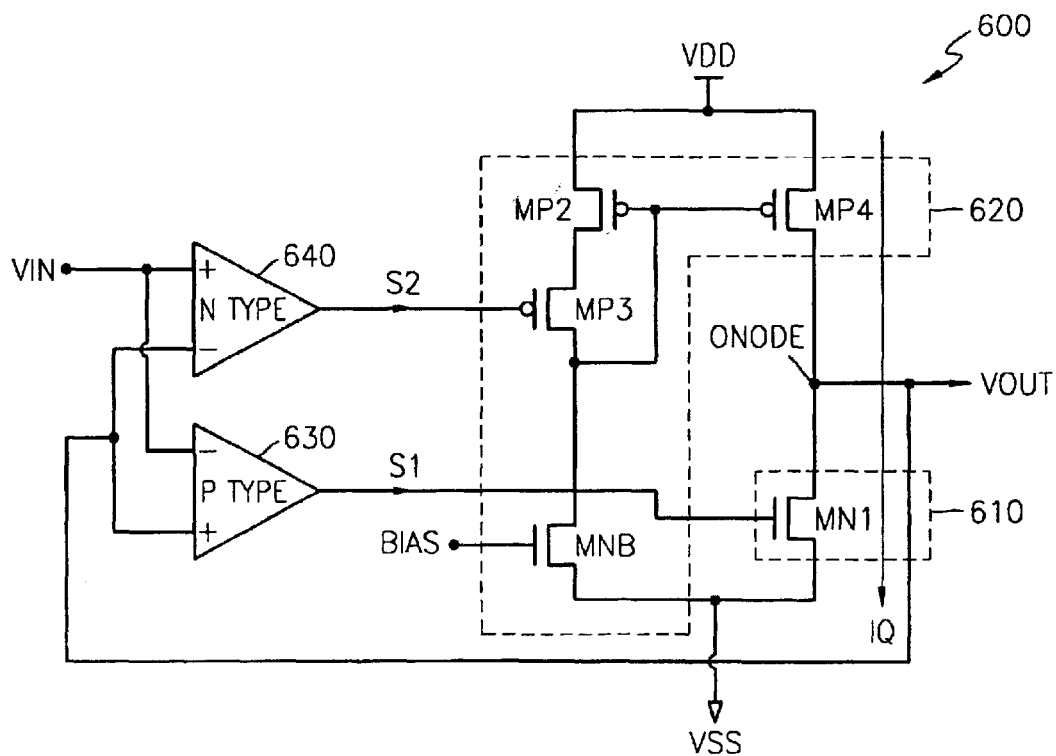
FIG. 6 is a diagram of an AB class amplifier according to a third embodiment of the present invention.

FIG. 6 is a diagram of an AB class amplifier according to a third embodiment of the present invention. Referring to FIG. 6, an AB class buffer amplifier 600 includes a first current controller 610 and a second current controller 620.

The first current controller 610 is turned on in response to a first logic level of a first signal S1 to sink current from an output node ONODE and turned off in response to a second logic level of the first signal S1.

The first signal S1 is generated at the second logic level if a level of an input voltage VIN is higher than a level of a voltage VOUT output from the output node ONODE and at the first logic level if the level of the input voltage VIN is lower than the level of the output voltage VOUT.

In more detail, the first current controller 610 is a first transistor MN1 having a first node connected to a ground voltage VSS, a second node connected to the output node ONODE, and a gate to which the first signal S1 is applied.

The second current controller 620 sources the current to the output node ONODE in response to the first logic level of the first signal S1, and buffers the input voltage VIN and then outputs it to the output node ONODE in response to the second logic level of the second signal S2.

The second signal S2 is generated at the first logic level if the level of the input voltage VIN is higher than the level of the output voltage VOUT of the output node ONODE and at the second level if the level of the input voltage VIN is lower than the level of the output voltage VOUT of the output node ONODE.

The current controller 620 includes second, third, and fourth transistors MP2, MP3, and MP4 and a bias transistor MNB.

A first node of the second transistor MP2 is connected to the power voltage VDD. A first node of the third transistor MP3 is connected to a second node of the second transistor MP2, a gate thereof is connected to the second signal S2, and a second node thereof is connected to a gate of the second transistor MP2.

A first transistor of the fourth transistor MP4 is connected to the power voltage VDD, a gate thereof is connected to a gate of the second transistor MP2, and a second node thereof is connected the output node ONODE. The bias transistor MNB is connected the second node of the third transistor MP3 and the ground voltage VSS and a predetermined bias voltage BIAS is applied to a gate thereof.

The first and bias transistors MN1 and MNB are NMOS transistors, and the second, third, and fourth transistors MP2, MP3, and MP4 are PMOS transistors.

The AB class amplifier may further include a differential amplifier 630 and a comparator 640.

The differential amplifier 630 receives the input voltage VIN via a negative node and the output voltage VOUT of the output node ONODE via a positive node, compares the level of the input voltage VIN with level of the output voltage VOUT, and generates the compared result as the first signal S1.

The comparator 640 receives the input voltage VIN via a positive node and the output voltage VOUT of the output node ONODE via a negative node, compares the level of the input voltage VIN with the level of the output voltage VOUT, and generates the compared result as the second signal S2.

Hereinafter, the operation of the AB class buffer amplifier 600 according to the third embodiment of the present invention will be described in detail with reference to FIG. 6.

The first current controller 610 is turned off in response to the second level of the first signal S1. Here, the second logic level is close to a low level. The second logic level can also saturate the third transistor MP3, this will be described later. The second logic level of the first signal S1 is generated if the level of the input voltage VIN is higher than the level of the output voltage VOUT of the output node ONODE.

If the level of the input voltage VIN is higher than the level of the output voltage VOUT of the output node ONODE, the second signal S2 is generated at the first logic level. Here, the first logic level is close to a high level. The first level can also saturate the first transistor MN1. Thus, the third transistor MP3 is turned off.

The bias voltage BIAS has a level for turning on the bias transistor MNB. In other words, the bias transistor MNB is kept turned on by the bias voltage BIAS. Thus, if the third transistor MP3 is turned off, voltage levels of the gates of the second and fourth transistors MP2 and MP4 become lower.

Then, a large amount of current flows from the power voltage VDD to the output node ONODE and the level of the output voltage VOUT becomes higher.

In other words, in a case where the level of the output voltage VOUT needs to be higher since the level of the output voltage VOUT is low, the AB class buffer amplifier 600 shown in FIG. 6 forms a current path from the power voltage VDD to the output node ONODE so as to increase the level of the output voltage VOUT at a high speed.

If the level of the input voltage VIN is lower than the level of the output voltage VOUT of the output node ONODE, the first signal S1 is output at the first logic level and the second signal S2 is output at the second logic level.

Then, the first transistor MN1 is saturated and the third transistor MP3 is also saturated. Since the third transistor MP3 is saturated, the second current controller 620 operates as a current mirror-type device and the amount of the quiescent current IQ is reduced. In other words, the amount of the quiescent current IQ can be controlled by controlling a ratio of the size of the second transistor MP2 to the size of the fourth transistor MP4.

By the first transistor MN1, the gate voltage of which is increased, a current path is formed from the output node ONODE to the ground voltage VSS and current flows to the ground voltage VSS. Thus, the level of the output voltage VOUT becomes lower.

In summary, if the level of the output voltage VOUT is higher than the level of the input voltage VIN, the first signal S1 is output at the first logic level to saturate the first transistor MN1 and the second signal S2 is output at the second logic level to saturate the third transistor MP3. Thus, the current is rapidly sunk and the level of the output voltage VOUT becomes lower.

In contrast, if the level of the output voltage VOUT is lower than the level of the input voltage VIN, the first signal S1 is output at the second logic level to turn off the first transistor MN1 and the second signal S2 is output at the first logic level to turn off the third transistor MP3. Thus, the current is rapidly sourced and the level of the output voltage VOUT becomes higher.

As described above, the AB class buffer amplifier 600 according to the third embodiment of the present invention can rapidly change the level of the output voltage VOUT by easily controlling the amount of the quiescent current IQ using the sizes of the transistors MP2 and MP4, and rapidly sourcing and sinking the current.

Figure 7:
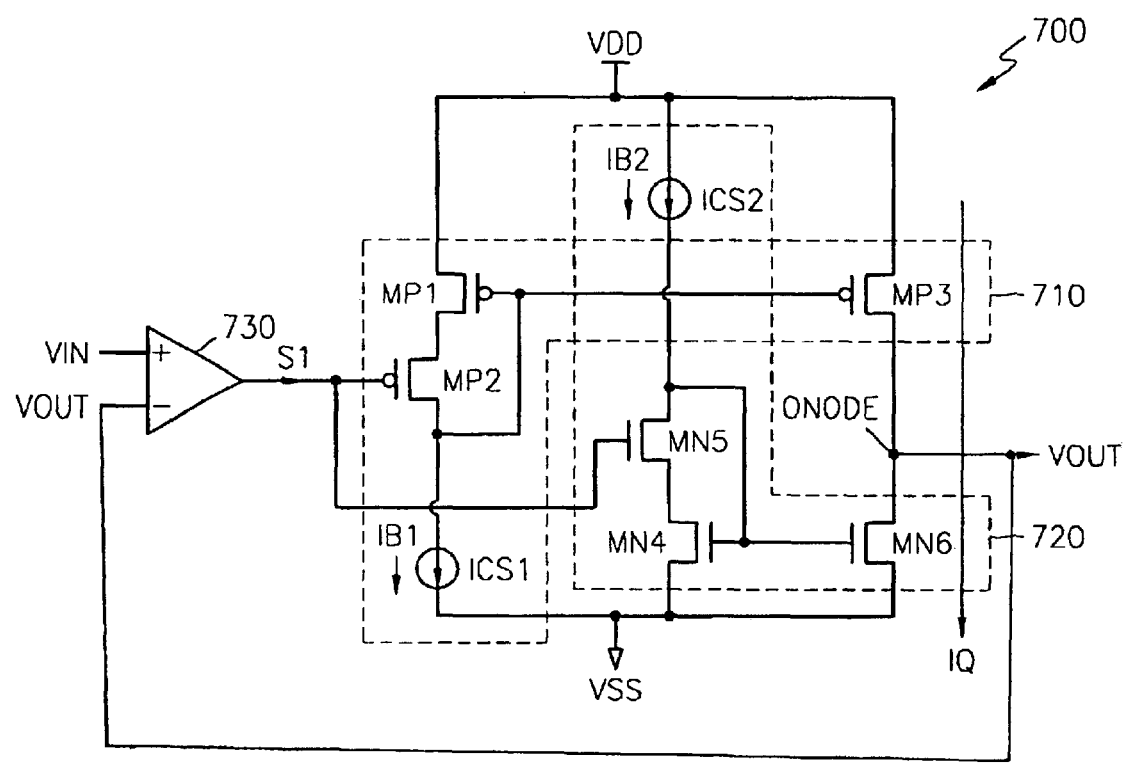
FIG. 7 is a diagram of an AB class amplifier according to a fourth embodiment of the present invention.

FIG. 7 is a diagram of an AB class amplifier according to a fourth embodiment of the present invention. Referring to FIG. 7, an AB class buffer amplifier 700 includes a first current controller 710, a second current controller 720, and a comparing unit 730.

The first current controller 710 sources current to an output node ONODE in response to a first logic level of a first signal S1, and buffers an input voltage VIN and then outputs it to the output node ONODE in response to a second logic level of the first signal S1.

The first signal S1 is generated at the first logic level if a level of the input voltage VIN is higher than a level of a voltage output from the output node ONODE, and at the second logic level if the level of the input voltage VIN is lower than the level of the output voltage of the output node ONODE.

In more detail, the first current controller 710 includes first, second, third transistors MP1, MP2, and MP3 and a first current source ICS1.

A first node of the first transistor MP1 is connected to a power voltage VDD. A first node of the second transistor MP2 is connected to a second node of the first transistor MP1, a gate thereof is connected to the first signal S1, and a second node thereof is connected to a gate of the first transistor MP1.

A first node of the third transistor MP3 is connected to the power voltage VDD, a gate thereof is connected to a gate of the second transistor MP2, and a second node thereof is connected to the output node ONODE. The first current source ICS1 is connected between the second node of the second transistor MP2 and a ground voltage VSS and generates a first bias current IB1.

The first, second, and third transistors MP1, MP2, and MP3 are PMOS transistors. The first current source ICS1 may be an NMOS transistor which is connected between the second node of the second transistor MP2 and the ground voltage VSS and a gate of which a predetermined first bias voltage BIAS is applied to.

The second current controller 720 buffers the input voltage VIN and outputs it to the output node ONODE in response to the first logic level of the first signal S1 and sinks current from the output node ONODE in response to the second logic level of the first signal S1.

The second current controller 720 includes fourth, fifth, and sixth transistors MN4, MN5, and MN6 and a second current source ICS2.

A first node of the fourth transistor MN4 is connected to the ground voltage VSS. A first node of the fifth transistor MN5 is connected to a second node of the fourth transistor MN4, a gate thereof is connected to the first signal S1, and a second node thereof is connected to a gate of the fourth transistor MN4.

A first node of the sixth transistor MN6 is connected to the ground voltage VSS, a gate thereof is connected to a gate of the fourth transistor MN4, and a second node thereof is connected to the output node ONODE.

The second current source ICS2 is connected between a second node of the fifth transistor MN5 and the power voltage VDD and generates a second bias current IB2. The fourth, fifth, and sixth transistors MN4, MN5, and MN6 are NMOS transistors. The second current source ICS2 may be an NMOS transistor which is connected between the second node of the fifth transistor MN5 and the power voltage VDD and a gate of which a predetermined second bias voltage BIAS is applied to.

The comparing unit 730 compares the input voltage with the output voltage VOUT of the output node ONODE and generates the compared result as the first signal S1. The comparing unit 730 is comparator which receives the input voltage VIN via a positive node and the output voltage VOUT via a negative node, compares the level of the input voltage VIN with the level of the output voltage VOUT, and generates the compared result as the first signal S1.

Hereinafter, the operation of the AB buffer amplifier 700 according to the fourth embodiment of the present invention will be described in detail with reference to FIG. 7.

The structures of the first and second current controllers 710 and 720 of the AB buffer amplifier 700 are the same as those of the first and second current controllers 410 and 420 of the AB class buffer amplifier 400 according to the first embodiment shown in FIG. 4. Only the structure of the comparing unit 730 is different. In other words, the comparing unit 430 according to the first embodiment uses the first and second comparators 431 and 432. However, the comparing unit 730 according to the fourth embodiment is configured as a single comparator.

The comparing unit 730 outputs the first signal S1 at the second logic level if the level of the output voltage VOUT is higher the level of the input voltage VIN. The second logic level saturates the second transistor MP2 and turns off the fifth transistor MN5.

If the second transistor MP2 is saturated, the first current controller 710 operates as a current mirror-type device so as to control the amount of the quiescent current IQ by a ratio of the size of the first transistor MP1 to the size of the third transistor MP3.

If the fifth transistor MN5 is turned off, gate voltages of the fourth and sixth transistors MN4 and MN6 of the second current controller 720 rise and a current path is formed form the output node ONODE to the ground voltage VSS. Thus, the current can rapidly be sunk and the level of the output voltage VOUT becomes lower.

In contrast, the comparing unit 730 outputs the first signal S1 at the first logic level if the level of the output voltage VOUT is lower than the level of the input voltage VIN. The first logic level can turn off the second transistor MP2 and saturate the fifth transistor MN5.

If the fifth transistor MN5 is saturated, the second current controller 720 operates as a current mirror-type device so as to control the amount of the quiescent current IQ according to the ratio of the size of the fourth transistor MN4 to the size of the sixth transistor MN6.

If the second transistor MP2 is turned off, gate voltages of the first and third transistors MP1 and MP3 of the first current controller 710 become lower and a current path is formed from the power voltage VDD to the output node ONODE. Thus, rapid sourcing of the current is possible and the level of the output voltage VOUT becomes higher.

The level of the output voltage VOUT becomes equal to the level of the input voltage VIN if the AB class buffer amplifier 700 operates as a buffer. Here, the comparing unit 730 generates the first signal S1 at a level for saturating both the second and fifth transistors MP2 and MN5 in order to reduce the amount of the quiescent current IQ.

The comparing unit 730, which outputs the first signal S1 having a voltage level for saturating both the second and fifth transistors MP2 and MN5 in order to reduce the amount of the quiescent current IQ, may be realized by one of ordinary skill in the art, and thus detailed description thereof will be omitted.

The AB class buffer amplifier 700 according to the fourth embodiment of the present invention is the same as the AB buffer amplifier 400 according to the first embodiment except for the structure of the comparing unit 730. Thus, detailed description of the operation of the fourth embodiment will be omitted.

As described above, an AB class buffer amplifier according to the present invention can drive an external circuit using high currents by freely controlling the amount of quiescent current, and easily sourcing and sinking quiescent current flowing to an output node of the amplifier.

While this invention has been particularly shown and described with references to preferred embodiments thereof, it will be understood by those skilled in the art that various changes in form and details may be made herein without departing from the spirit and scope of the invention as defined by the appended claims.

What is claimed is:

1. An AB class buffer amplifier capable of controlling quiescent current, the AB class buffer amplifier comprising:

a first current controller which sources current to an output node in response to a first logic level of a first signal, and buffers and outputs an input voltage to the output node in response to a second logic level of the first signal; and a second current controller which sinks the current from the output node in response to a second logic level of a second signal, and buffers and outputs the input voltage to the output node in response to a first logic level of the second signal;

wherein the first current controller comprises:
a first transistor, a first node of which is connected to a power voltage;
a second transistor, a first node of which is connected to a second node of the first transistor, a gate of which is supplied with the first signal, and a second node of which is connected to a gate of the first transistor;
a third transistor, a first node of which is connected to the power voltage, a gate of which is connected to a gate of the first transistor, and a second node of which is connected to the output node; and
a first current source which is connected between the second node of the second transistor and a ground voltage, and generates a first bias current.

2. The AB class buffer amplifier of claim 1, further comprising a comparing unit which compares the input voltage with an output voltage from the output node and generates the first and second signals in response to the compared results.

3. The AB class buffer amplifier of claim 2, wherein the comparing unit comprises:

a first comparator which receives the input voltage via a positive node and the output voltage via a negative node, compares the input voltage with the output voltage, and generates the first signal; and a second comparator which receives the input voltage via a positive node and the output voltage via a negative node, compares the input voltage with the output voltage, and generates the second signal.

4. The AB class buffer amplifier of claim 1, wherein the first and second signals are generated at the first logic levels if the input voltage is higher than the output voltage and at the second logic level if the input voltage is lower than the output voltage.

5. The AB class buffer amplifier of claim 1, wherein the first through third transistors are PMOS transistors.

6. The AB class buffer amplifier of claim 1, wherein the first current source is an NMOS transistor having a gate to which a predetermined first bias voltage is applied.

7. An AB class buffer amplifier capable of controlling quiescent current, the AB class buffer amplifier comprising:
a first current controller which sources current to an output node in response to a first logic level of a first signal, and buffers and outputs an input voltage to the output node in response to a second logic level of the first signal; and
a second current controller which sinks the current from the output node in response to a second logic level of a second signal, and buffers and outputs the input voltage to the output node in response to a first logic level of the second signal, wherein the second current controller comprises:
a first transistor, a first node of which is connected to a ground voltage;
a second transistor, a first node of which is connected to a second node of the first transistor, a gate of which is connected to the second signal, and a second node of which is connected to a gate of the first transistor;
a third transistor, a first node of which is connected to the ground voltage, a gate of which is connected to a gate of the first transistor, and a second node of which is connected to the output node; and
a first current source which is connected between the second node of the second transistor and the power voltage, and generates a second bias current.

8. The AB class buffer amplifier of claim 7, wherein the first through third transistors are NMOS transistors.

9. The AB class buffer amplifier of claim 7, wherein the first current source is a PMOS transistor having a gate to which a predetermined bias voltage is applied.

10. An AB class buffer amplifier capable of controlling quiescent current, the AB class buffer amplifier comprising:
a first current controller which is turned off in response to a first logic level of a first signal and turned on in response to a second logic level of the first signal in order to source current to an output node; and
a second current controller which sinks the current from the output node in response to a second logic level of a second signal, and buffers and outputs an input voltage to the output node in response to a first logic level of the second signal;
wherein the first current controller comprises a first transistor, a first node of which is connected to a power voltage, a second node of which is connected to the output node, and a gate of which is connected to the first signal, and wherein the second current controller comprises:

a second transistor, a first node of which is connected to a ground voltage;
a third transistor, a first node of which is connected to a second node of the second transistor, a gate of which is connected to the second signal, and a second node of which is connected to a gate of the second transistor;
a fourth transistor, a first node of which is connected to the ground voltage, a gate of which is connected to a gate of the second transistor, and a second node of which is connected to the output node; and
a bias transistor which is connected between the second node of the third transistor and the power voltage, and has a gate to which a predetermined bias voltage is applied.

11. The AB class buffer amplifier of claim 10, further comprising:
a differential amplifier which receives the input voltage via a negative node and an output voltage from the output node via a positive node, compares the input voltage with the output voltage, and generates a comparison result as the first signal; and
a comparator which receives the input voltage via a positive node and the output voltage via a negative node, and compares the input voltage with the output voltage, and generates a comparison result as the second signal.

12. The AB class buffer amplifier of claim 10, wherein the first signal is generated at the second logic level if the input voltage is higher than the output voltage and at the first logic level if the input voltage is lower than the output voltage of the output node, and the second signal is generated at the first logic level if the input voltage is higher than the output voltage of the output node and at the second logic level if the input voltage is lower than the output voltage of the output node.

13. The AB class buffer amplifier of claim 10, wherein the first transistor and the bias transistor are PMOS transistors, and the second through fourth transistors are NMOS transistors.

14. An AB class buffer amplifier capable of controlling quiescent current, the AB class buffer amplifier comprising:
a first current controller which is turned on in response to a first logic level of a first signal in order to sink current from an output node and turned off in response to a second logic level of the first signal; and
a second current controller which sources current to the output node in response to a first logic level of the second signal, and buffers and outputs an input voltage to the output node in response to a second logic level of the second signal;
wherein the first current controller comprises a first transistor, a first node of which is connected the ground voltage, a second node of which is connected to the output node, a gate of which the first signal is applied to, and wherein the second current controller comprises:
a second transistor, a first node of which is connected to the power voltage;
a third transistor, a first node of which is connected a second node of the second transistor, a gate of which is connected to the second signal, and a second node of which is connected to a gate of the second transistor;

a fourth transistor, a first node of which is connected to the power voltage, a gate of which is connected to the gate of the second transistor, and a second node of which is connected to the output node; and a bias transistor which is connected between the second node of the third transistor and the ground voltage, and has a gate to which a predetermined bias voltage is applied.

15. The AB class buffer amplifier of claim 14, further comprising:

a differential amplifier which receives the input voltage via a negative node and a voltage output from the output node via a positive node, compares the input voltage with the output voltage, and generates a comparison result as the first signal; and a comparator which receives the input voltage via a positive node and the output voltage of the output node via negative node, compares the input voltage with the output voltage of the output node, and generates a result of the comparison as the second signal.

16. The AB class buffer amplifier of claim 14, wherein the first signal is generated at the second logic level if the input voltage is higher than the output voltage and at the first logic level if the input voltage is lower than the output voltage, and the second signal is generated at the first logic level if the input voltage is higher than the output voltage and as the second logic level if the input voltage is lower than the output voltage of the output node.

17. The AB class buffer amplifier of claim 14, wherein the first transistor and the bias transistor are NMOS transistors, and the second through fourth transistors are PMOS transistors.

18. An AB class buffer amplifier capable of controlling quiescent current, the AB class buffer amplifier comprising:

a first current controller which sources current to an output node in response to a first logic level of a first signal, and buffers and outputs an input voltage to the output node in response to a second logic level of the first signal;

a second current controller which buffers the input voltage in response to the first logic level of the first signal and outputs it to the output node, and sinks current from the output node in response to the second logic level of the first signal; and a comparing unit which compares a level of the input voltage with a level of the output voltage and generates a comparison result as the first signal;

wherein the first current controller comprises:
 a first transistor, a first node of which is connected to a power voltage;
 a second transistor, a first node of which is connected to a second node of the first transistor, a gate of which is supplied with the first signal, and a second node of which is connected to a gate of the first transistor;
 a third transistor, a first node of which is connected to the power voltage, a gate of which is connected to a gate of the first transistor, and a second node of which is connected to the output node; and
 a first current source which is connected between the second node of the second transistor and a ground voltage, and generates a first bias current.

19. The AB class buffer amplifier of claim 18, wherein the comparing unit is a comparator which receives the input voltage via a positive node and the output voltage of the output node via a negative node, compares the input voltage with the output voltage, and generates a comparison result as the first signal.

20. The AB class buffer amplifier of claim 18, wherein the first signal is generated at the first logic level if the input voltage is higher than the output voltage of the output node and at the second logic level if the input voltage is lower than the output voltage of the output node.

21. The AB class buffer amplifier of claim 18, wherein the first through third transistors are PMOS transistors.

22. The AB class buffer amplifier of claim 18, wherein the first current source is an NMOS transistor having a gate to which a predetermined first bias voltage is applied.

23. An AB class buffer amplifier capable of controlling quiescent current, the AB class buffer amplifier comprising:

a first current controller which sources current to an output node in response to a first logic level of a first signal, and buffers and outputs an input voltage to the output node in response to a second logic level of the first signal;

a second current controller which buffers the input voltage in response to the first logic level of the first signal and outputs it to the output node, and sinks current from the output node in response to the second logic level of the first signal; and a comparing unit which compares a level of the input voltage with a level of the output voltage and generates a comparison result as the first signal, wherein the second current controller comprises:
 a first transistor, a first node of which is connected to a ground voltage;
 a second transistor, a first node of which is connected to a second node of the first transistor, a gate of which is supplied with the first signal, and a second node of which is connected to a gate of the first transistor;
 a third transistor, a first node of which is connected to the ground voltage, a gate of which is connected to a gate of the first transistor, and a second node of which is connected to the output node; and
 a first current source which is connected between the second node of the second transistor and the power voltage, and generates a second bias current.

24. The AB class buffer amplifier of claim 23, wherein the first through third transistors are NMOS transistors.

25. The AB class buffer amplifier of claim 23, wherein the first current source is a PMOS transistor having a gate to which a predetermined second bias voltage is applied.

26. The AB class buffer amplifier of claim 7, further comprising a comparing unit which compares the input voltage with an output voltage from the output node and generates the first and second signals in response to the compared results.

27. The AB class buffer amplifier of claim 26, wherein the comparing unit comprises:

a first comparator which receives the input voltage via a positive node and the output voltage via a negative node, compares the input voltage with the output voltage, and generates the first signal; and a second comparator which receives the input voltage via a positive node and the output voltage via a negative node, compares the input voltage with the output voltage, and generates the second signal.

28. The AB class buffer amplifier of claim 7, wherein the first and second signals are generated at the first logic levels if the input voltage is higher than the output voltage and at the second logic level if the input voltage is lower than the output voltage.

29. The AB class buffer amplifier of claim 23, wherein the comparing unit is a comparator which receives the input voltage via a positive node and the output voltage of the output node via a negative node, compares the input voltage with the output voltage, and generates a comparison result as the first signal.

30. The AB class buffer amplifier of claim 23, wherein the first signal is generated at the first logic level if the input voltage is higher than the output voltage of the output node and at the second logic level if the input voltage is lower than the output voltage of the output node.

* * * * *